(12) United States Patent
Mathiyalagan et al.

(10) Patent No.: US 12,117,469 B2
(45) Date of Patent: Oct. 15, 2024

(54) PER-PART REAL-TIME LOAD-LINE MEASUREMENT APPARATUS AND METHOD

(71) Applicant: Intel Corporation, Santa Clara, CA (US)

(72) Inventors: Vijay Anand Mathiyalagan, Chennai (IN); Stephen Gunther, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 769 days.

(21) Appl. No.: 17/128,070

(22) Filed: Dec. 19, 2020

(65) Prior Publication Data
US 2021/0132123 A1 May 6, 2021

(51) Int. Cl.
*G01R 19/25* (2006.01)
*H02J 4/00* (2006.01)

(52) U.S. Cl.
CPC ............ *G01R 19/2513* (2013.01); *H02J 4/00* (2013.01)

(58) Field of Classification Search
CPC . G01R 19/2513; G01R 19/16552; H02J 4/00; H02J 7/007182; Y02D 10/00; G06F 1/324; G06F 1/3296; G06F 1/3206
USPC .................................. 324/113, 76.11, 207.12
See application file for complete search history.

(56) References Cited

U.S. PATENT DOCUMENTS

| | | | | |
|---|---|---|---|---|
| 10,749,576 B2* | 8/2020 | Tramoni | ................. | H02M 7/06 |
| 11,327,552 B1* | 5/2022 | Rapaka | ................. | G06F 1/3287 |
| 2017/0338661 A1* | 11/2017 | Marchya | .................. | G06F 1/26 |
| 2021/0232206 A1* | 7/2021 | Matula | .................. | G06F 1/3287 |
| 2021/0382805 A1* | 12/2021 | Gendler | ................ | G06F 9/4403 |
| 2022/0037899 A1* | 2/2022 | Natarajan | ................. | G06F 1/28 |

OTHER PUBLICATIONS

Waizman et al., "Integrated power supply frequency domain impedance meter (IFDIM)", Electrical Performance of Electronic Packaging—2004, Portland, OR, USA, 2004, pp. 217-220, doi: 10.1109/EPEP.2004.1407591. pp. 217-220 (4 pages).

* cited by examiner

*Primary Examiner* — Giovanni Astacio-Oquendo
(74) *Attorney, Agent, or Firm* — Schwabe, Williamson & Wyatt, P.C.

(57) ABSTRACT

A scheme for measuring AC and DC load-line (LL) using voltage and current monitoring apparatus. During calibration for LL measurement, a tested or known workload is executed on a processor or system-on-chip (SoC). The calibration can be done when the processor is first used in a real-time system (customer) scenario, or repeated whenever necessary to compensate silicon aging or other effects that affect the LL values. LL is estimated, determined, and/or calculated for each power supply rail in the processor or SoC. The measured LL is used in calculations that determine the operating voltage of an input voltage regulator (VR) at run time, thereby optimizing the power/performance characteristics of that specific system.

20 Claims, 7 Drawing Sheets

PER-PART REAL-TIME LOAD-LINE MEASUREMENT APPARATUS AND METHOD

BACKGROUND

Load-line (LL) values for a given processor design vary per-system or part-part (e.g., per processor die) due to manufacturing tolerances. In typical systems, the LL values are derived as static values based on pre-silicon simulation or post-silicon estimates. Also, the LL values are not derived on a per-system basis. Because of this, the LL values are prone to be guard-banded significantly, which results in higher voltage for the voltage supply which in turn negatively impacts energy efficiency and performance.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
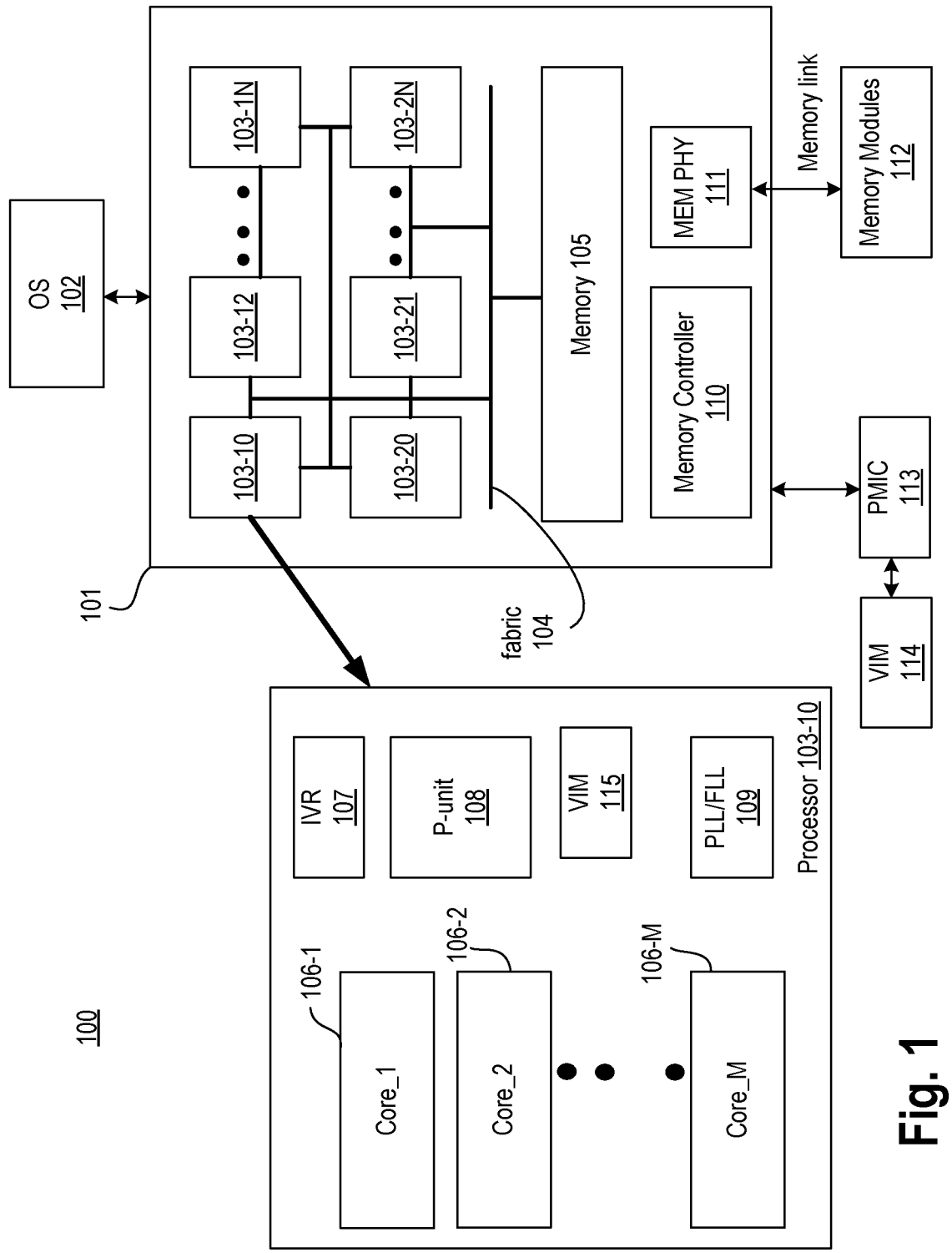
FIG. 1 illustrates a processor system with logic to determine, measure, and/or calibrate a load-line (LL), in accordance with some embodiments.

Some embodiments describe a calibration and measurement process in real-time for a Load-line (LL) of a processor (e.g., SoC). Various embodiments include voltage and current monitoring apparatus to determine or measure Alternating Current (AC) or trainset LL and Direct Current (DC) or steady-state LL. LL is voltage over current. During calibration, a tested or known workload is executed on the SoC. The calibration is recommended to be done when the SoC is first used in a real-time system (customer) scenario. Also, the calibration can be repeated whenever necessary to compensate silicon aging or other effects that affect the LL values. In some embodiments, LL is estimated, determined, and/or calculated for each power supply rail in the SoC. In some embodiments, the measured LL is used in calculations that determine the operating voltage of an input voltage regulator (VR) at run time, thereby optimizing the power/performance characteristics of that specific system.

In some embodiments, an apparatus comprises a voltage regulator having an input supply rail to provide an input power, and an output supply rail to provide an output power. The voltage regulator can be DC-DC converter such as a buck, boost, or buck-boost converter. Other linear regulators can also be used for the voltage regulator. For example, a low dropout (LDO) regulator may be used to implement the voltage regulator. The voltage regulator regulates the output power relative to a reference. In some embodiments, a processor is coupled to the output supply rail, and a voltage and/or current measurement apparatus is coupled to the processor. In some embodiments, the voltage measurement apparatus measures (or estimates) voltage and/or current on the output supply rail. For example, current and/or voltage sensors are used to monitor and/or measure the current and/or voltage on the output supply rail. In some embodiments, the apparatus includes logic to determine an AC loadline and a DC loadline from the voltage and/or current in response to execution of one or more workloads on the processor. In some embodiments, the logic introduces a current step via the one or more workloads to cause an output voltage on the output supply rail to droop. As such, the logic captures the AC and DC voltage and current steady-states in real-time.

In some embodiments, the logic measures a first voltage and/or current during a steady-state condition of the output voltage on the output supply rail, wherein the steady-state condition occurs when the current step has a constant current which is substantially zero. In some embodiments, the logic measures a second voltage and/or current during an active steady-state condition of the output voltage on the output supply rail, wherein the active steady-state condition occurs when the current step completes its ramp and the output voltage exhibits a third voltage droop. Here, active steady-state refers to a region of the voltage and/or current on the output supply rail which corresponds to the $3^{rd}$ voltage droop on the output supply rail. The active steady-state may also be captured at other time-points along the transient behavior of the output supply.

In some embodiments, the logic stores the first voltage and/or current and a second voltage and/or current in memory. The memory can be non-volatile memory or volatile memory. Examples of non-volatile memory include ferroelectric random-access memory (FeRAM), magnetic RAM (MRAM), phase change memory (PCM), resistive RAM (ReRAM), etc. Examples, of volatile memory include static RAM (SRAM), dynamic RAM (DRAM), etc. In some embodiments, logic determines the AC loadline by dividing the second voltage by the second current. In some embodiments, the logic determines the DC loadline by dividing the first voltage by the first current. In some embodiments, the processor has multiple power supply rails for multiple power supply domains, wherein the logic determines an AC loadline and a DC loadline for each of the multiple power supply rails.

The AC and DC LL values are used to set the voltage level of a VR that supplies power to the SoC. Any over-estimation or errors in the LL values result in higher VR voltage, which negatively impacts energy efficiency and performance Various embodiments apply LL calculation on a per-system basis, which enables setting of proper VR voltage. As such, voltage guard-band used in today's systems is reduced, hence reducing power consumption. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

FIG. 1 illustrates processor system 100 with logic to determine, measure, and/or calibrate a load-line (LL) in real-time, in accordance with some embodiments. Here, real-time refers to an actual time when an event takes place. The event in this example as the workload(s) that are executed on a processor to achieve steady-state and active steady-state conditions, which are used to measure or calibrate the LL. As such, LL is measured or calibrated in real-time user real working conditions. The following section describes an architecture of a processor with various blocks used for determining or calibrating the LL.

Processor system 100 comprises processor 101 coupled to operating system (OS) 102. Processor 101 comprises one or more processors 103 (individually labeled as processors 103_10 through 103_1N, and 103_20 through 103_2N, where 'N' is a number), fabric 104 connecting the processor 103, memory 105, memory controller 110, and memory physical layer (MEM PHY) 111. In some embodiments, each processor 103 is a die, dielet, or chiplet. Here the term "die" generally refers to a single continuous piece of semiconductor material (e.g. silicon) where transistors or other components making up a processor core may reside. Multicore processors may have two or more processors on a single die, but alternatively, the two or more processors may be provided on two or more respective dies. Each die has a dedicated power controller or power control unit (p-unit) power controller or power control unit (p-unit) which can be dynamically or statically configured as a supervisor or supervisee. In some examples, dies are of the same size and functionality i.e., symmetric cores. However, dies can also be asymmetric. For example, some dies have different size and/or function than other dies. Each processor 103 may also be a dielet or chiplet. Here the term "dielet" or "chiplet" generally refers to a physically distinct semiconductor die, typically connected to an adjacent die in a way that allows the fabric across a die boundary to function like a single fabric rather than as two distinct fabrics. Thus at least some dies may be dielets. Each dielet may include one or more p-units which can be dynamically or statically configured as a supervisor, supervisee or both.

In some embodiments, fabric 104 is a collection of interconnects or a single interconnect that allows the various dies to communicate with one another. Here the term "fabric" generally refers to communication mechanism having a known set of sources, destinations, routing rules, topology and other properties. The sources and destinations may be any type of data handling functional unit such as power management units. Fabrics can be two-dimensional spanning along an x-y plane of a die and/or three-dimensional (3D) spanning along an x-y-z plane of a stack of vertical and horizontally positioned dies. A single fabric may span multiple dies. A fabric can take any topology such as mesh topology, star topology, daisy chain topology. A fabric may be part of a network-on-chip (NoC) with multiple agents. These agents can be any functional unit.

In some embodiments, each processor 103 may include a number of processor cores. One such example is illustrated with reference to processor 103_10. In this example, processor 103_10 includes a plurality of processor cores 106-1 through 106-M, where M is a number. For the sake of simplicity, a processor core is referred by the general label 106. Here, the term "processor core" generally refers to an independent execution unit that can run one program thread at a time in parallel with other cores. A processor core may include a dedicated power controller or power control unit (p-unit) which can be dynamically or statically configured as a supervisor or supervisee. This dedicated p-unit is also referred to as an autonomous p-unit, in some examples. In some examples, all processor cores are of the same size and functionality i.e., symmetric cores. However, processor cores can also be asymmetric.

For example, some processor cores have different size and/or function than other processor cores. A processor core can be a virtual processor core or a physical processor core. Processor 103_10 may include an integrated voltage regulator (IVR) 107, power control unit (p-unit) 108, phase locked loop (PLL) and/or frequency locked loop (FLL) 109. The various blocks of processor 103_10 may be coupled via an interface or fabric. Here, the term "interconnect" refers to a communication link, or channel, between two or more points or nodes. It may comprise one or more separate conduction paths such as wires, vias, waveguides, passive components, and/or active components. It may also comprise a fabric. In some embodiments, p-unit 108 is coupled to OS 102 via an interface. Here the term "interface" generally refers to software and/or hardware used to communicate with an interconnect. An interface may include logic and I/O driver/receiver to send and receive data over the interconnect or one or more wires.

In some embodiments, each processor 103 is coupled to a power supply via voltage regulator. The voltage regulator may be internal to processor system 101 (e.g., on the package of processor system 101) or external to processor system 101. In some embodiments, each processor 103 includes IVR 107 that receives a primary regulated voltage from the voltage regulator of processor system 101 and generates an operating voltage for the agents of processor 103. The agents of processor 103 are the various components of processor 103 including cores 106, IVR 107, p-unit 108, PLL/FLL 109, etc.

Accordingly, an implementation of IVR 107 may allow for fine-grained control of voltage and thus power and performance of each individual core 106. As such, each core 106 can operate at an independent voltage and frequency, enabling great flexibility and affording wide opportunities for balancing power consumption with performance. In some embodiments, the use of multiple IVRs enables the grouping of components into separate power planes, such that power is regulated and supplied by the IVR to only those components in the group. For example, each core 106 may include an IVR to manage power supply to that core where that IVR receives input power supply from the regulated output of IVR 107 or voltage regulator of processor system 101. During power management, a given power domain of one IVR may be powered down or off when the processor core 106 is placed into a certain low power state, while another power domain of another IVR remains active, or fully powered. As such, an IVR may control a certain domain of a logic or processor core 106. Here the term "domain" generally refers to a logical or physical perimeter that has similar properties (e.g., supply voltage, operating frequency, type of circuits or logic, and/or workload type) and/or is controlled by a particular agent. For example, a domain may be a group of logic units or function units that are controlled by a particular supervisor. A domain may also be referred to an Autonomous Perimeter (AP). A domain can be an entire system-on-chip (SoC) or part of the SoC, and is governed by a p-unit.

In some embodiments, each processor 103 includes its own p-unit 108. P-unit 108 controls the power and/or performance of processor 103. P-unit 108 may control power and/or performance (e.g., IPC, frequency) of each individual core 106. In various embodiments, p-unit 108 of each processor 103 is coupled via fabric 104. As such, the p-units 108 of each processor 103 communicate with another and OS 102 to determine the optimal power state of processor system 101 by controlling power states of individual cores 106 under their domain.

P-unit 108 may include circuitry including hardware, software and/or firmware to perform power management operations with regard to processor 103. In some embodiments, p-unit 108 provides control information to voltage regulator of processor system 101 via an interface to cause the voltage regulator to generate the appropriate regulated voltage. In some embodiments, p-unit 108 provides control information to IVRs of cores 106 via another interface to control the operating voltage generated (or to cause a corresponding IVR to be disabled in a low power mode). In some embodiments, p-unit 108 may include a variety of power management logic units to perform hardware-based power management. Such power management may be wholly processor controlled (e.g., by various processor hardware, and which may be triggered by workload and/or power, thermal or other processor constraints) and/or the power management may be performed responsive to external sources (such as a platform or power management source or system software). In some embodiments, p-unit 108 is implemented as a microcontroller.

The microcontroller can be an embedded microcontroller which is a dedicated controller or as a general-purpose controller. In some embodiments, p-unit 108 is implemented as a control logic configured to execute its own dedicated power management code, here referred to as pCode. In some embodiments, power management operations to be performed by p-unit 108 may be implemented externally to a processor 103, such as by way of a separate power management integrated circuit (PMIC) 113 or other component external to processor system 101. In yet other embodiments, power management operations to be performed by p-unit 108 may be implemented within BIOS or other system software. In some embodiments, p-unit 108 of a processor 103 may assume a role of a supervisor or supervisee.

Here the term "supervisor" generally refers to a power controller, or power management, unit (a "p-unit"), which monitors and manages power and performance related parameters for one or more associated power domains, either alone or in cooperation with one or more other p-units. Power/performance related parameters may include but are not limited to domain power, platform power, voltage, voltage domain current, die current, load-line, temperature, device latency, utilization, clock frequency, processing efficiency, current/future workload information, and other parameters. It may determine new power or performance parameters (limits, average operational, etc.) for the one or more domains. These parameters may then be communicated to supervisee p-units, or directly to controlled or monitored entities such as VR or clock throttle control registers, via one or more fabrics and/or interconnects. A supervisor learns of the workload (present and future) of one or more dies, power measurements of the one or more dies, and other parameters (e.g., platform level power boundaries) and determines new power limits for the one or more dies. These power limits are then communicated by supervisor p-units to the supervisee p-units via one or more fabrics and/or interconnect. In examples where a die has one p-unit, a supervisor (Svor) p-unit is also referred to as supervisor die.

Here the term "supervisee" generally refers to a power controller, or power management, unit (a "p-unit"), which monitors and manages power and performance related parameters for one or more associated power domains, either alone or in cooperation with one or more other p-units and receives instructions from a supervisor to set power and/or performance parameters (e.g., supply voltage, operating frequency, maximum current, throttling threshold, etc.) for its associated power domain. In examples where a die has one p-unit, a supervisee (Svee) p-unit may also be referred to as a supervisee die. Note that a p-unit may serve either as a Svor, a Svee, or both a Svor/Svee p-unit.

In various embodiments, p-unit 108 executes a firmware (referred to as pCode) that communicates with OS 102. In various embodiments, each processor 103 includes a PLL or FLL 109 that generates clock from p-unit 108 and input clock (or reference clock) for each core 106. Cores 106 may include or be associated with independent clock generation circuitry such as one or more PLLs to control operating frequency of each core 106 independently. In some embodiments, memory controller (MC) 110 manages read and/or write operations with one or more memory modules 112. The memory modules 112 are coupled to processor 101 via memory physical layer (MEM PHY) 111.

In some embodiments, PMIC 113 coupled to processor system 101 (or SoC) and/or IVR 107 for each processor 103 determines LL for its domain. The domain of PMIC 113 in this example is processor system 101 while the domain of IVR 107 is processor 103 (e.g., 103_10). In some embodiments, each processor core may have its own IVR (not shown). In some embodiments, each processor core may determine the LL for its domain.

In some embodiments, voltage and current monitoring (VIM) apparatus 114 is provided to determine or measure AC or trainset LL and DC or steady-state LL. The VIM apparatus can be on-die or off-die. In some embodiments, each voltage domain has a corresponding VIM apparatus. In some embodiments, VIM apparatus 114 is coupled to an external VR or PMIC 113 to measure voltage and/or current at the input supply of the external VR. In one example, processor 103_10 includes VIM apparatus 115 to monitor voltage and/or current of IVR 107 (e.g., output regulated supply of IVR 107 and/or input supply of IVR 107).

During calibration, a tested or known workload is executed on processor 101. The calibration is recommended to be done when processor 101 is first used in a real-time system (customer) scenario. Also, the calibration can be repeated whenever necessary to compensate silicon aging or other effects that affect the LL values. In some embodiments, the measured LL is used in calculations that determine the operating voltage of the input VR at run time, thereby optimizing the power/performance characteristics of that specific system.

In some embodiments, data or measurement of voltage and/or current is received by a p-unit that makes the data accessible to software (e.g., OS 102 or any other suitable application) via firmware (pCode). In some embodiments, a supervisor p-unit collects voltage and/or current measurement from each supervisee p-unit under its domain. In this example, each p-unit collects voltage and/or current information from a VIM under its domain and reports that data to its supervisor p-unit till the top-level supervisor p-unit receives all data. An original equipment manufacturer (OEM) can access that data to optimize the voltage guard-band for an external VR (and/or internal IVRs) to improve power and/or performance of that system. For example, excess guard-band can be reduced for each VR using the LL data.

Figure 2:
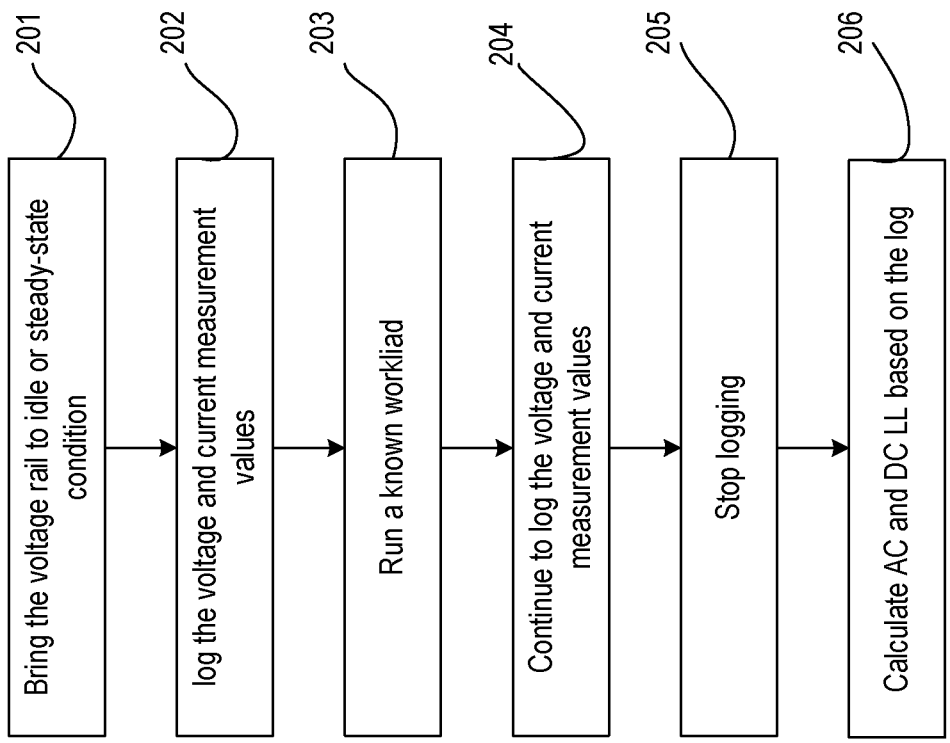
FIG. 2 illustrates a flowchart of a method to determine, measure, and/or calibrate a LL in real-time, in accordance with some embodiments.

FIG. 2 illustrates flowchart 200 of a method to determine, measure, and/or calibrate a LL, in accordance with some embodiments. While the blocks of the flowchart are shown in a particular order, the order can be modified. For example, some blocks may be performed before others and some may be performed in parallel. Some or all blocks may be performed by hardware, software, or a combination of them. Examples of hardware include p-unit, PMIC, VIM apparatus, etc. Examples of software include firmware (e.g., pCode), operating system (OS), application software, drivers, etc.

In some embodiments, the various logic blocks of SoC 101 are coupled together via a Network Bus. Any suitable protocol may be used to implement the network bus. In some embodiments, machine-readable storage medium is provided which includes instructions (also referred to as the program software code/instructions) for determining, measuring, and/or calibrating a LL in real-time.

Figure 7:
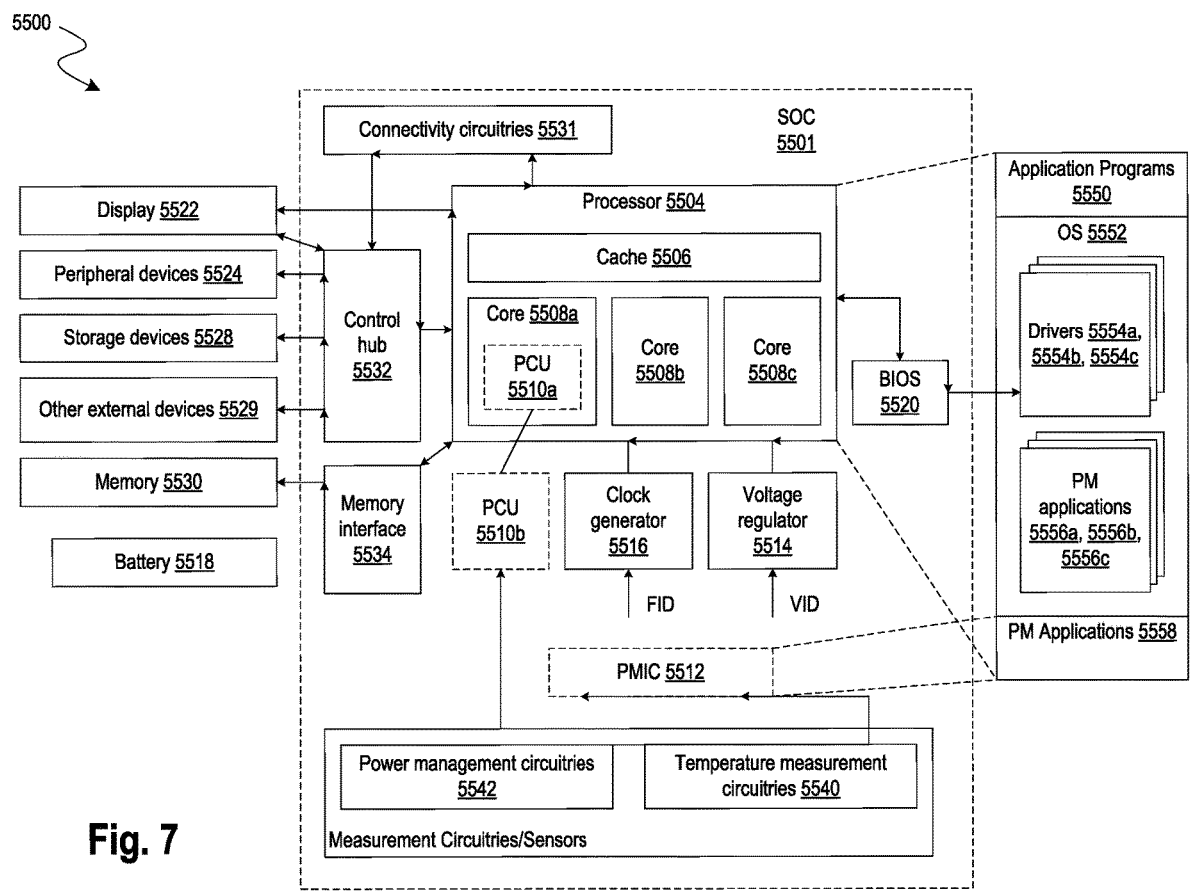
FIG. 7 illustrates a smart device or a computer system or an SoC (System-on-Chip) with hardware and/or software to determine, measure, and/or calibrate a LL in real-time, in accordance with some embodiments.

At block 201, steady-state condition is achieved for the various power supply voltage rails of processor 101 (or SoC of FIG. 7). These power supply voltage rails include internal rails to various power domains, and/or external rail that provides regulated input power supply to processor 101 (or SoC of FIG. 7). In some embodiments, steady-state condition is achieved by running a workload that performs no action or task. One reason for executing the process of block 201 is to have a reference voltage level for the calibration process. In one example, steady-state condition is achieved by not running any workload on processor 101 that draws current from the voltage rail for which calibration is being performed. In another example, OS 102 runs a stable workload on processor 101. The stable workload is one that maintains a stable voltage (e.g., consumes stable or substantially constant current) on the power supply rail.

At block 202, VIM apparatus(es) begin to measure and log the voltage and/or current measuring values for the power supply rails in steady-state. In some embodiments, a VIM apparatus includes current and/or voltage sensors that measure the flow of current through the power supply rail and voltage across the power supply rail and a reference rail (e.g., a ground supply rail). Any suitable current and/or voltage sensor can be used for measuring or sensing the current and/or voltage. In some embodiments, the VIM apparatus(us) are controlled by a p-unit (e.g., a Supervisor p-unit). The outputs of the VIM apparatuses may be converted into a digital code. For example, the analog current and/or analog voltage measured by the VIM apparatus may be converted into a corresponding digital code(s) by an analog-to-digital converter (ADC) and stored in registers. These registers may be accessible to p-unit and/or pCode. In some embodiments, the registers are accessible via pins on the SoC.

At block 203, OS 102 runs a known workload on processor 101 or (SoC of FIG. 7). The known workload consumes a fairly (but not substantially) constant current. One purpose of running this workload is to create a step-current behavior in the voltage rail that generate the first, second, and third droops on the output supply rail (which is input to processor 101) and also on the supply rails of the voltage domains of processor 101.

Figure 3:
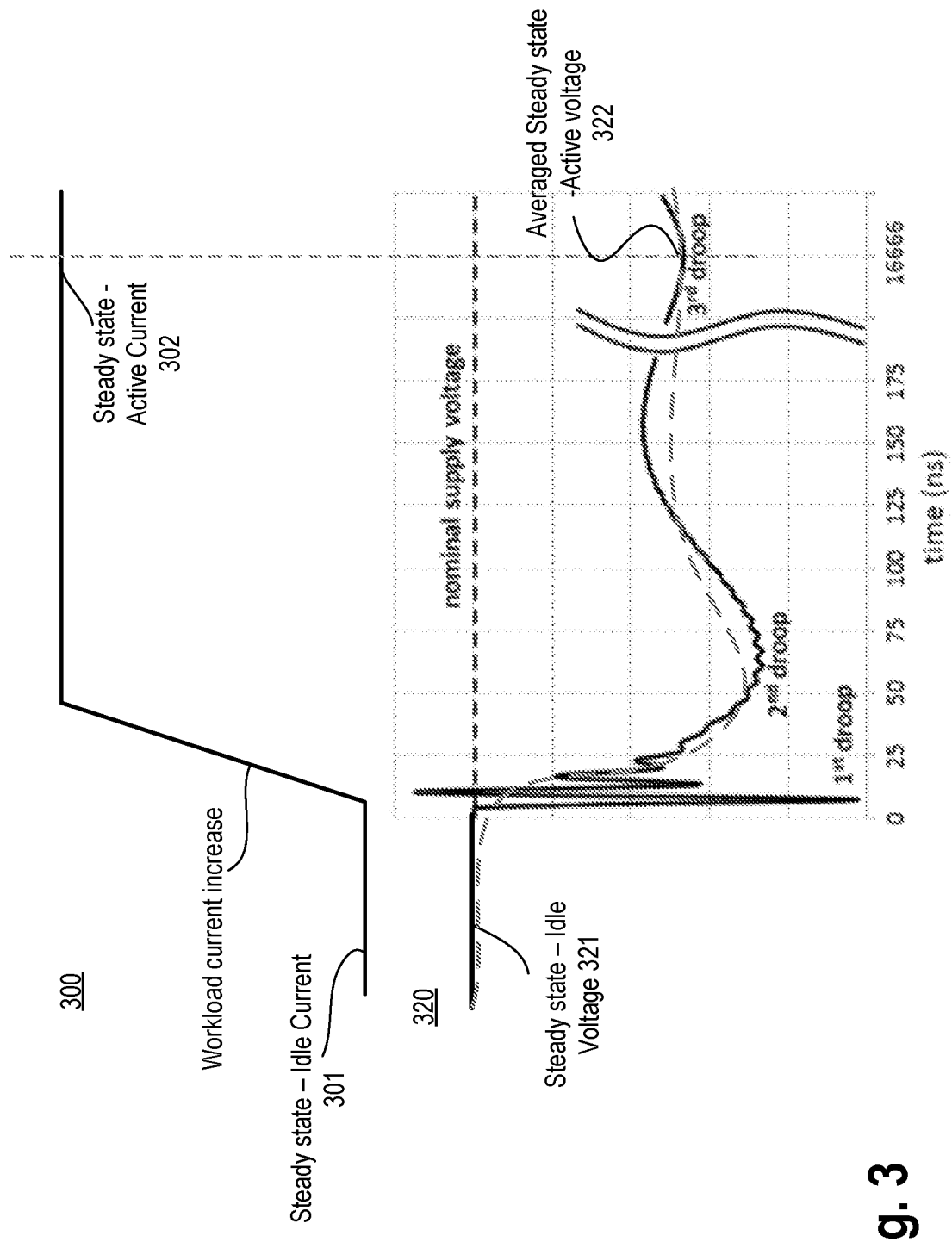
FIG. 3 illustrates a set of plots showing setup-current and voltage droop behavior, and steady state idle and active regions for determining, measuring, and/or calibrating a LL in real-time, in accordance with some embodiments.

FIG. 3 illustrates a set of plots 300 showing setup-current and voltage droop behavior, and steady state idle and active regions for determining, measuring, and/or calibrating a LL, in accordance with some embodiments. Plot 300 shows a step current while plot 320 shows a corresponding voltage response on the power supply rail. The voltage response shows the first, second and third droops. In some embodiments, the steady-state idle current and voltage are sampled in region 301, while the transient (here steady-state active) voltage and current correspond to the $3^{rd}$ droop and sampled in region 302.

Referring back to FIG. 2, in some embodiments when steady-state idle or active currents are not constant, then averaging over a period of time (e.g., a time period where the voltage and/or currents are relatively stable) can be used to generate the steady-state idle or active currents. As discussed herein, the steady-state active voltage can be measured after a short period from the end of the steady-state idle voltage. This period can be anywhere the third droop is expected or detected.

At block 204, the VIM apparatus continues to log the voltage and/or current associated with the power supply rail in a domain, as discussed with reference to block 202. In some embodiments, the impedance changes at the $3^{rd}$ droop can also be used to determine the voltage and/or current for steady-state active case. In frequency domain, the impedance changes at the $3^{rd}$ droop occurs at 1 Mhz (e.g., 1 microsecond period), but it depends on the amount of decoupling and the specific platform, the bandwidth of the voltage regulator, etc. Since both AC and DC LLs are used in the calculations, large enough voltage window to capture both is used, hence 10 us may be enough for this example. Note, the second droop may not be affected as much by the input VR or the motherboard decoupling capacitance. The second droop is more a function of package level decoupling capacitance. The third droop and the second droop are separated enough that filtering the voltage measurement to see the lowest voltage over a time window of something like 0.5 us to 10 us may provide the sampling point for the steady-state active voltage and/or current measurement. At block 205, the process of logging the voltage and/or current for steady-state active case is stopped and AC and DC LL is calculated at block 206.

AC LL can be calculated as follows in accordance with some embodiments: $\Delta Vac = Vactive - Vac$, where $\Delta Vac$ is voltage difference between "steady state–idle" (see region 321) voltage and the lowest voltage from the log. The lowest voltage is due to the voltage droop because of current-step. Here, Vactive is the "Steady state–Idle" voltage (region 322) while Vac is the lowest voltage from the log. The change in current is given as: $\Delta I = I\_active - I\_idle$, where I_active is averaged, "Steady state–Active" (e.g., region 302), current from the log, and I_idle is the averaged "Steady state–Idle" current from the log. In some embodiments, if there is minor fluctuation (e.g., about 10% or any programmable or pre-determined threshold) in the current, the average current number is used. The AC LL is then computed as: $LLac = \Delta Vac / \Delta I$.

DC LL can be calculated as follows in accordance with some embodiments: ΔI=I_active−I_idle, where I_active is averaged "Steady state−Active" (302) current from the log, I_idle is averaged "Steady state−Idle" (region 302) current from the log. If there is minor fluctuation (e.g., about 10% or any programmable or predetermined threshold) in the current, average current number is used. LL DC is then computed as LLdc=ΔVdc/ΔI.

Voltage and current measurement errors are common and if they vary in opposite direction, the Loadline value error may be much larger. The following example shows the impact of the error, followed by a calibration process to mitigate the error. In this example, Vac and Iac can have +/−10% variation, where a typical value of Vac is 1 V and Iac is 1 A. In an ideal case, where there is no error, LLac=1 V/1 A=1Ω.

In the worst-case scenario (in the negative direction), Vac measurement has −10% error, hence Vac measured is 0.9 V. Iac measurement has +10% error, hence Iac measured is 1.1 A. As such, LLac=0.9 V/1.1 A=0.81Ω, which means LLac calculated has −19% error. In the worst-case scenario (in the position direction), Vac measurement has +10% error, hence Vac measured is 1.1V; and Iac measurement has −10% error, hence Iac measured is 0.9 A. As such, LLac=1.1 V/0.9 A=1.22Ω, which means LLac calculated has +22% error. In this example, if Vac and Iac have +/−10% variation, LLac calculated can vary from −19% to +22% error.

In some embodiments, the computation of the LLac and LLdc are performed by program software code/instructions executed on a processor (e.g., processor 101). Program software code/instructions associated with various embodiments executed to implement embodiments of the disclosed subject matter may be implemented as part of an operating system or a specific application, component, program, object, module, routine, or other sequence of instructions or organization of sequences of instructions referred to as "program software code/instructions," "operating system program software code/instructions," "application program software code/instructions," or simply "software" or firmware embedded in processor. In some embodiments, the program software code/instructions associated with various embodiments are executed by system.

In some embodiments, the program software code/instructions associated with various embodiments are stored in a computer executable storage medium and executed by the processor. Here, computer executable storage medium is a tangible machine-readable medium that can be used to store program software code/instructions and data that, when executed by a computing device, causes one or more processors to perform a method(s) as may be recited in one or more accompanying claims directed to the disclosed subject matter.

The tangible machine-readable medium may include storage of the executable software program code/instructions and data in various tangible locations, including for example ROM, volatile RAM, non-volatile memory and/or cache and/or other tangible memory as referenced in the present application. Portions of this program software code/instructions and/or data may be stored in any one of these storage and memory devices. Further, the program software code/instructions can be obtained from other storage, including, e.g., through centralized servers or peer to peer networks and the like, including the Internet. Different portions of the software program code/instructions and data can be obtained at different times and in different communication sessions or in the same communication session.

The software program code/instructions, associated with various embodiments, and data can be obtained in their entirety prior to the execution of a respective software program or application by the computing device. Alternatively, portions of the software program code/instructions and data can be obtained dynamically, e.g., just in time, when needed for execution. Alternatively, some combination of these ways of obtaining the software program code/instructions and data may occur, e.g., for different applications, components, programs, objects, modules, routines or other sequences of instructions or organization of sequences of instructions, by way of example. Thus, it is not required that the data and instructions be on a tangible machine readable medium in entirety at a particular instance of time.

Examples of tangible computer-readable media include but are not limited to recordable and non-recordable type media such as volatile and non-volatile memory devices, read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs), etc.), ferroelectric memory, resistive RAM, phase change memory (PCM), magnetic RAM (MRAM, among others. The software program code/instructions may be temporarily stored in digital tangible communication links while implementing electrical, optical, acoustical or other forms of propagating signals, such as carrier waves, infrared signals, digital signals, etc. through such tangible communication links.

In general, tangible machine readable medium includes any tangible mechanism that provides (i.e., stores and/or transmits in digital form, e.g., data packets) information in a form accessible by a machine (i.e., a computing device), which may be included, e.g., in a communication device, a computing device, a network device, a personal digital assistant, a manufacturing tool, a mobile communication device, whether or not able to download and run applications and subsidized applications from the communication network, such as the Internet, e.g., an iPhone®, Galaxy®, or the like, or any other device including a computing device. In one embodiment, processor-based system is in a form of or included within a PDA (personal digital assistant), a cellular phone, a notebook computer, a tablet, a game console, a set top box, an embedded system, a TV (television), a personal desktop computer, etc. Alternatively, the traditional communication applications and subsidized application(s) may be used in some embodiments of the disclosed subject matter.

In some embodiments, the machine-readable storage media having machine-readable instructions stored thereon, that when executed cause one or more processors to perform a method comprising executing one or more workloads, wherein the one or more processors are coupled to an output supply rail, wherein a voltage regulator is to generate an output power on the output supply rail using an input power from an input supply rail. The method further comprises measuring voltage and/or current on the output supply rail; and determining an AC loadline and a DC loadline from the voltage and/or current on the output supply rail in response to the execution of the one or more workloads.

In some embodiments, the method comprises introducing a current step via the one or more workloads to cause an output voltage on the output supply rail to droop. In some embodiments, the method comprises measuring the voltage and/or current on the output supply rail comprises measuring a first voltage and/or current during a steady-state condition of the output voltage on the output supply rail, wherein the steady-state condition occurs when the current step has constant current which is substantially zero. In some embodiments, measuring the voltage and/or current on the output supply rail comprises: measuring a second voltage and/or current during an active steady-state condition of the output voltage on the output supply rail, wherein the active steady-state condition occurs when the current step completes its ramp and the output voltage exhibits a third voltage droop. In some embodiments, the method comprises storing the first voltage and/or current and a second voltage and/or current in memory. In some embodiments, the method comprises determining the AC loadline by dividing the second voltage by the second current; and determining the DC loadline by dividing the first voltage by the first current.

Figure 4:
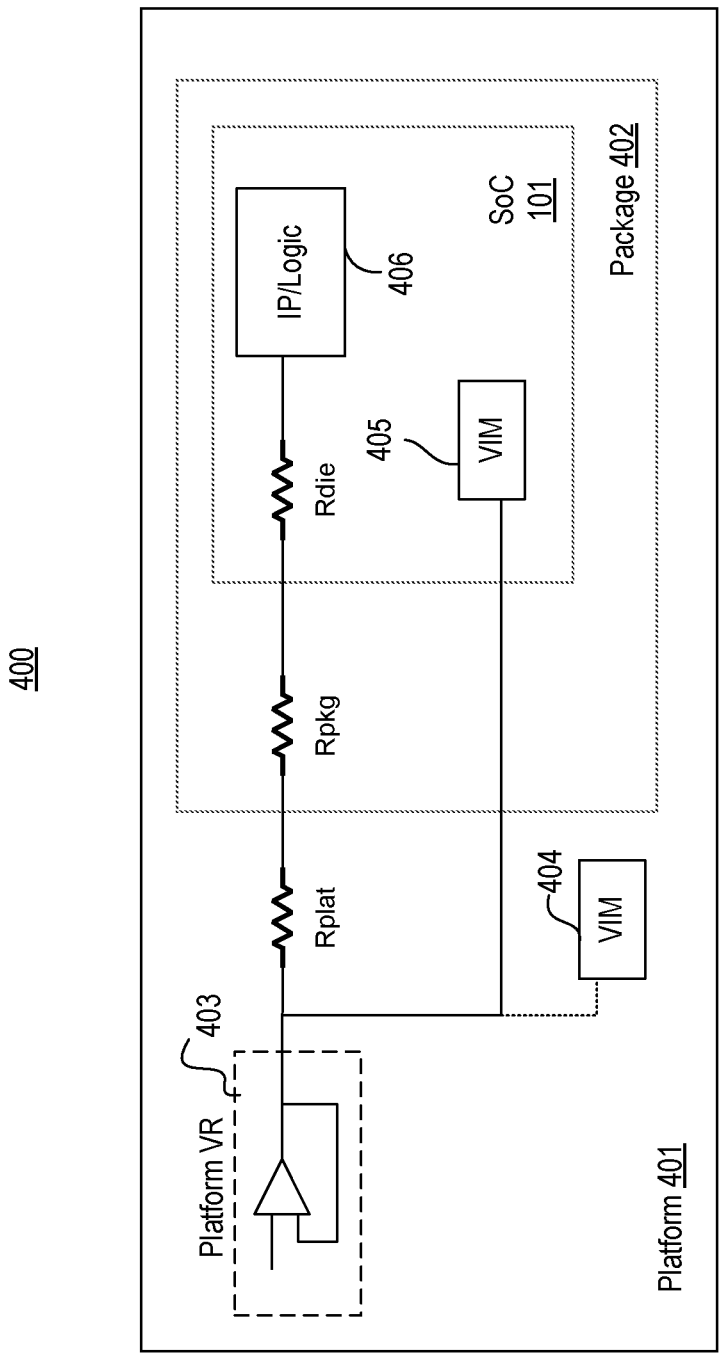
FIG. 4 illustrates an apparatus for voltage measuring at a platform in real-time, in accordance with some embodiments.

FIG. 4 illustrates apparatus 400 for voltage measuring at a platform, in accordance with some embodiments. In some embodiments, apparatus 400 comprises platform 401, package 402, SoC or processor 101, platform VR 403, VIM apparatus 404, VIM apparatus 405, and intellectual property (IP) block and logic 406. The resistances model the impedances of the platform (Rplat), package (Rpkg), and die (Rdie). AC LL is measured at platform 401. To measure the voltage, a signal trace can be routed from the appropriate platform location to the VIM apparatus 405, which can be either in SoC or outside SoC (as shown as VIM apparatus 404). There are many industry-wide mechanisms available for voltage measurement.

Figure 5:
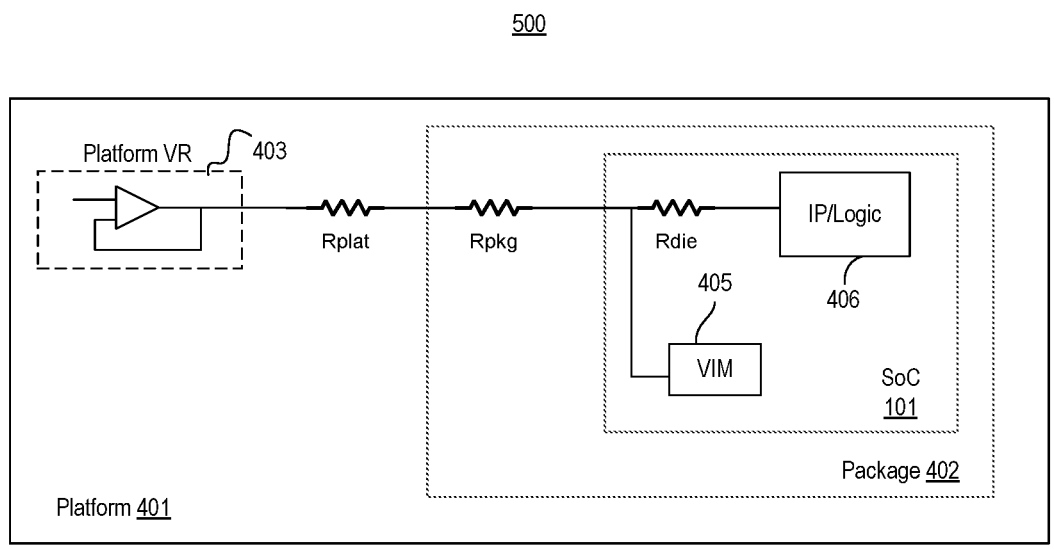
FIG. 5 illustrates an apparatus for voltage measuring at a system-on-chip (SoC) in real-time, in accordance with some embodiments.

FIG. 5 illustrates apparatus 500 for voltage measuring at a system-on-chip (SoC), in accordance with some embodiments. Compared to apparatus 500, here VIM apparatus 405 is inside SoC 101 where voltage measurement is done. The voltage measured can be low-pass filtered (e.g., filter frequency depending on implementation) to get the AC LL at platform 401.

Figure 6:
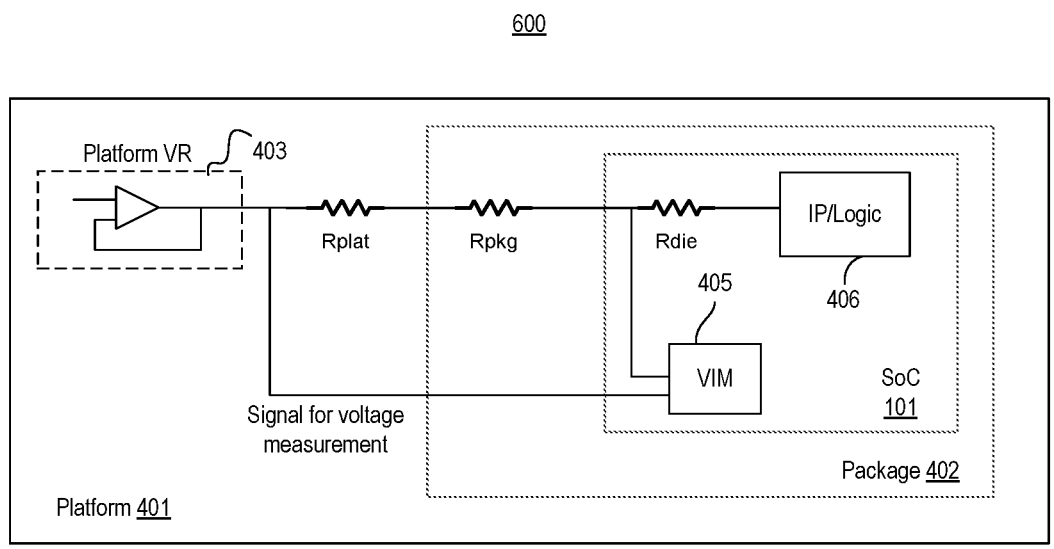
FIG. 6 illustrates an apparatus for calibrating of voltage measurement at a SoC in real-time, in accordance with some embodiments.

FIG. 6 illustrates apparatus 600 for calibrating of voltage measurement at a SoC, in accordance with some embodiments. Depending on the need, AC LL can be measured at any other location in the Power-Delivery-Network (PDN) by routing the signal from the appropriate location to the VIM apparatus, which can be either in SoC 101 or outside SoC 101.

In some embodiments, for voltage measurement at platform 401, when IP 406 is in inactive state (or IP 406 is in inactive state or power-gated), a known voltage is set at VR 403 and voltage measurement is done at VIM apparatus 405 (or 404 of FIG. 4). This measurement is used to calibrate VIM apparatus 405 (or 404 of FIG. 4) to reduce or minimize voltage error. In some cases, there still may be VR set-point and ripple error—approximately 0.5-1% in typical VR deigns. The ripple error can also be calibrated. For voltage rails with multiple high current IPs, the distribution of the load current might matter. The calculated LL depends on how close the load is to the sense point, how distributed the load is across the power input bumps, etc. In practice, this might take some experimentation on each product to determine how best to stimulate the power delivery network.

Here, the term "calibration" generally refers to calibrating voltage and current measurement hardware. In some embodiments, by performing calibration of these hardware separately, measurement errors can be reduced. In some embodiments, calibration is done first and after that the process performed by the scheme of various embodiments (e.g., FIG. 2) is executed for measuring load-line.

FIG. 7 illustrates a smart device or a computer system or an SoC (System-on-Chip) with hardware and/or software to determine, measure, and/or calibrate a LL, in accordance with some embodiments. It is pointed out that those elements of FIG. 7 having the same reference numbers (or names) as the elements of any other figure may operate or function in any manner similar to that described, but are not limited to such. Any block in this smart device can have the apparatus for dynamically optimizing battery charging voltage.

In some embodiments, device 5500 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 5500.

In an example, the device 5500 comprises an SoC (System-on-Chip) 5501. An example boundary of the SoC 5501 is illustrated using dotted lines in FIG. 7, with some example components being illustrated to be included within SoC 5501—however, SoC 5501 may include any appropriate components of device 5500.

In some embodiments, device 5500 includes processor 5504. Processor 5504 can include one or more physical devices, such as microprocessors, application processors, microcontrollers, programmable logic devices, processing cores, or other processing implementations such as disaggregated combinations of multiple compute, graphics, accelerator, I/O and/or other processing chips. The processing operations performed by processor 5504 include the execution of an operating platform or operating system on which applications and/or device functions are executed. The processing operations include operations related to I/O (input/output) with a human user or with other devices, operations related to power management, operations related to connecting computing device 5500 to another device, and/or the like. The processing operations may also include operations related to audio I/O and/or display I/O.

In some embodiments, processor 5504 includes multiple processing cores (also referred to as cores) 5508a, 5508b, 5508c. Although merely three cores 5508a, 5508b, 5508c are illustrated in FIG. 7, processor 5504 may include any other appropriate number of processing cores, e.g., tens, or even hundreds of processing cores. Processor cores 5508a, 5508b, 5508c may be implemented on a single integrated circuit (IC) chip. Moreover, the chip may include one or more shared and/or private caches, buses or interconnections, graphics and/or memory controllers, or other components.

In some embodiments, processor 5504 includes cache 5506. In an example, sections of cache 5506 may be dedicated to individual cores 5508 (e.g., a first section of cache 5506 dedicated to core 5508a, a second section of cache 5506 dedicated to core 5508b, and so on). In an example, one or more sections of cache 5506 may be shared among two or more of cores 5508. Cache 5506 may be split in different levels, e.g., level 1 (L1) cache, level 2 (L2) cache, level 3 (L3) cache, etc.

In some embodiments, processor core 5504 may include a fetch unit to fetch instructions (including instructions with conditional branches) for execution by the core 5504. The instructions may be fetched from any storage devices such as the memory 5530. Processor core 5504 may also include a decode unit to decode the fetched instruction. For example, the decode unit may decode the fetched instruction into a plurality of micro-operations. Processor core 5504 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 5504 may be an out-of-order processor core in one embodiment. Processor core 5504 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 5504 may also include a bus unit to enable communication between components of processor core 5504 and other components via one or more buses. Processor core 5504 may also include one or more registers to store data accessed by various components of the core 5504 (such as values related to assigned app priorities and/or sub-system states (modes) association.

In some embodiments, device 5500 comprises connectivity circuitries 5531. For example, connectivity circuitries 5531 includes hardware devices (e.g., wireless and/or wired connectors and communication hardware) and/or software components (e.g., drivers, protocol stacks), e.g., to enable device 5500 to communicate with external devices. Device 5500 may be separate from the external devices, such as other computing devices, wireless access points or base stations, etc.

In an example, connectivity circuitries 5531 may include multiple different types of connectivity. To generalize, the connectivity circuitries 5531 may include cellular connectivity circuitries, wireless connectivity circuitries, etc. Cellular connectivity circuitries of connectivity circuitries 5531 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 5531 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 5531 may include a network interface, such as a wired or wireless interface, e.g., so that a system embodiment may be incorporated into a wireless device, for example, a cell phone or personal digital assistant.

In some embodiments, device 5500 comprises control hub 5532, which represents hardware devices and/or software components related to interaction with one or more I/O devices. For example, processor 5504 may communicate with one or more of display 5522, one or more peripheral devices 5524, storage devices 5528, one or more other external devices 5529, etc., via control hub 5532. Control hub 5532 may be a chipset, a Platform Control Hub (PCH), and/or the like.

For example, control hub 5532 illustrates one or more connection points for additional devices that connect to device 5500, e.g., through which a user might interact with the system. For example, devices (e.g., devices 5529) that can be attached to device 5500 include microphone devices, speaker or stereo systems, audio devices, video systems or other display devices, keyboard or keypad devices, or other I/O devices for use with specific applications such as card readers or other devices.

As mentioned above, control hub 5532 can interact with audio devices, display 5522, etc. For example, input through a microphone or other audio device can provide input or commands for one or more applications or functions of device 5500. Additionally, audio output can be provided instead of, or in addition to display output. In another example, if display 5522 includes a touch screen, display 5522 also acts as an input device, which can be at least partially managed by control hub 5532. There can also be additional buttons or switches on computing device 5500 to provide I/O functions managed by control hub 5532. In one embodiment, control hub 5532 manages devices such as accelerometers, cameras, light sensors or other environmental sensors, or other hardware that can be included in device 5500. The input can be part of direct user interaction, as well as providing environmental input to the system to influence its operations (such as filtering for noise, adjusting displays for brightness detection, applying a flash for a camera, or other features).

In some embodiments, control hub 5532 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 5522 represents hardware (e.g., display devices) and software (e.g., drivers) components that provide a visual and/or tactile display for a user to interact with device 5500. Display 5522 may include a display interface, a display screen, and/or hardware device used to provide a display to a user. In some embodiments, display 5522 includes a touch screen (or touch pad) device that provides both output and input to a user. In an example, display 5522 may communicate directly with the processor 5504. Display 5522 can be one or more of an internal display device, as in a mobile electronic device or a laptop device or an external display device attached via a display interface (e.g., DisplayPort, etc.). In one embodiment display 5522 can be a head mounted display (HMD) such as a stereoscopic display device for use in virtual reality (VR) applications or augmented reality (AR) applications.

In some embodiments, and although not illustrated in the figure, in addition to (or instead of) processor 5504, device 5500 may include Graphics Processing Unit (GPU) comprising one or more graphics processing cores, which may control one or more aspects of displaying contents on display 5522.

Control hub 5532 (or platform controller hub) may include hardware interfaces and connectors, as well as software components (e.g., drivers, protocol stacks) to make peripheral connections, e.g., to peripheral devices 5524.

It will be understood that device 5500 could both be a peripheral device to other computing devices, as well as have peripheral devices connected to it. Device 5500 may have a "docking" connector to connect to other computing devices for purposes such as managing (e.g., downloading and/or uploading, changing, synchronizing) content on device 5500. Additionally, a docking connector can allow device 5500 to connect to certain peripherals that allow computing device 5500 to control content output, for example, to audiovisual or other systems.

In addition to a proprietary docking connector or other proprietary connection hardware, device 5500 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 5531 may be coupled to control hub 5532, e.g., in addition to, or instead of, being coupled directly to the processor 5504. In some embodiments, display 5522 may be coupled to control hub 5532, e.g., in addition to, or instead of, being coupled directly to processor 5504.

In some embodiments, device 5500 comprises memory 5530 coupled to processor 5504 via memory interface 5534. Memory 5530 includes memory devices for storing information in device 5500.

In some embodiments, memory 5530 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 5530 can be a dynamic random-access memory (DRAM) device, a static random-access memory (SRAM) device, flash memory device, phase-change memory device, or some other memory device having suitable performance to serve as process memory. In one embodiment, memory 5530 can operate as system memory for device 5500, to store data and instructions for use when the one or more processors 5504 executes an application or process. Memory 5530 can store application data, user data, music, photos, documents, or other data, as well as system data (whether long-term or temporary) related to the execution of the applications and functions of device 5500.

Elements of various embodiments and examples are also provided as a machine-readable medium (e.g., memory 5530) for storing the computer-executable instructions (e.g., instructions to implement any other processes discussed herein). The machine-readable medium (e.g., memory 5530) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 5500 comprises temperature measurement circuitries 5540, e.g., for measuring temperature of various components of device 5500. In an example, temperature measurement circuitries 5540 may be embedded, or coupled or attached to various components, whose temperature are to be measured and monitored. For example, temperature measurement circuitries 5540 may measure temperature of (or within) one or more of cores 5508*a*, 5508*b*, 5508*c*, voltage regulator 5514, memory 5530, a motherboard of SoC 5501, and/or any appropriate component of device 5500. In some embodiments, temperature measurement circuitries 5540 include a low power hybrid reverse (LPHR) bandgap reference (BGR) and digital temperature sensor (DTS), which utilizes subthreshold metal oxide semiconductor (MOS) transistor and the PNP parasitic Bi-polar Junction Transistor (BJT) device to form a reverse BGR that serves as the base for configurable BGR or DTS operating modes. The LPHR architecture uses low-cost MOS transistors and the standard parasitic PNP device. Based on a reverse bandgap voltage, the LPHR can work as a configurable BGR. By comparing the configurable BGR with the scaled base-emitter voltage, the circuit can also perform as a DTS with a linear transfer function with single-temperature trim for high accuracy.

In some embodiments, device 5500 comprises power measurement circuitries 5542, e.g., for measuring power consumed by one or more components of the device 5500. In an example, in addition to, or instead of, measuring power, the power measurement circuitries 5542 may measure voltage and/or current. In an example, the power measurement circuitries 5542 may be embedded, or coupled or attached to various components, whose power, voltage, and/or current consumption are to be measured and monitored. For example, power measurement circuitries 5542 may measure power, current and/or voltage supplied by one or more voltage regulators 5514, power supplied to SoC 5501, power supplied to device 5500, power consumed by processor 5504 (or any other component) of device 5500, etc.

In some embodiments, device 5500 comprises one or more voltage regulator circuitries, generally referred to as voltage regulator (VR) 5514. VR 5514 generates signals at appropriate voltage levels, which may be supplied to operate any appropriate components of the device 5500. Merely as an example, VR 5514 is illustrated to be supplying signals to processor 5504 of device 5500. In some embodiments, VR 5514 receives one or more Voltage Identification (VID) signals, and generates the voltage signal at an appropriate level, based on the VID signals. Various type of VRs may be utilized for the VR 5514. For example, VR 5514 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 5510*a/b* and/or PMIC 5512. In some embodiments, each core has a network of distributed LDOs to provide efficient control for power management. The LDOs can be digital, analog, or a combination of digital or analog LDOs. In some embodiments, VR 5514 includes current tracking apparatus to measure current through power supply rail(s).

In some embodiments, VR 5514 includes a digital control scheme to manage states of a proportional-integral-derivative (PID) filter (also known as a digital Type-III compensator). The digital control scheme controls the integrator of the PID filter to implement non-linear control of saturating the duty cycle during which the proportional and derivative terms of the PID are set to 0 while the integrator and its internal states (previous values or memory) is set to a duty cycle that is the sum of the current nominal duty cycle plus a deltaD. The deltaD is the maximum duty cycle increment that is used to regulate a voltage regulator from ICCmin to ICCmax and is a configuration register that can be set post silicon. A state machine moves from a non-linear all ON state (which brings the output voltage Vout back to a regulation window) to an open loop duty cycle which maintains the output voltage slightly higher than the required reference voltage Vref. After a certain period in this state of open loop at the commanded duty cycle, the state machine then ramps down the open loop duty cycle value until the output voltage is close to the Vref commanded. As such, output chatter on the output supply from VR 5514 is completely eliminated (or substantially eliminated) and there is merely a single undershoot transition which could lead to a guaranteed Vmin based on a comparator delay and the di/dt of the load with the available output decoupling capacitance.

In some embodiments, VR 5514 includes a separate self-start controller, which is functional without fuse and/or trim information. The self-start controller protects VR 5514 against large inrush currents and voltage overshoots, while being capable of following a variable VID (voltage identification) reference ramp imposed by the system. In some embodiments, the self-start controller uses a relaxation oscillator built into the controller to set the switching frequency of the buck converter. The oscillator can be initialized using either a clock or current reference to be close to a desired operating frequency. The output of VR 5514 is coupled weakly to the oscillator to set the duty cycle for closed loop operation. The controller is naturally biased such that the output voltage is always slightly higher than the set point, eliminating the need for any process, voltage, and/or temperature (PVT) imposed trims.

In some embodiments, device 5500 comprises one or more clock generator circuitries, generally referred to as clock generator 5516. Clock generator 5516 generates clock signals at appropriate frequency levels, which may be supplied to any appropriate components of device 5500. Merely as an example, clock generator 5516 is illustrated to be supplying clock signals to processor 5504 of device 5500. In some embodiments, clock generator 5516 receives one or more Frequency Identification (FID) signals, and generates the clock signals at an appropriate frequency, based on the FID signals.

In some embodiments, device 5500 comprises battery 5518 supplying power to various components of device 5500. Merely as an example, battery 5518 is illustrated to be supplying power to processor 5504. Although not illustrated in the figures, device 5500 may comprise a charging circuitry, e.g., to recharge the battery, based on Alternating Current (AC) power supply received from an AC adapter.

In some embodiments, battery 5518 periodically checks an actual battery capacity or energy with charge to a preset voltage (e.g., 4.1 V). The battery then decides of the battery capacity or energy. If the capacity or energy is insufficient, then an apparatus in or associated with the battery slightly increases charging voltage to a point where the capacity is sufficient (e.g. from 4.1 V to 4.11 V). The process of periodically checking and slightly increase charging voltage is performed until charging voltage reaches specification limit (e.g., 4.2 V). The scheme described herein has benefits such as battery longevity can be extended, risk of insufficient energy reserve can be reduced, burst power can be used as long as possible, and/or even higher burst power can be used.

In some embodiments, the charging circuitry (e.g., 5518) comprises a buck-boost converter. This buck-boost converter comprises DrMOS or DrGaN devices used in place of half-bridges for traditional buck-boost converters. Various embodiments here are described with reference to DrMOS. However, the embodiments are applicable to DrGaN. The DrMOS devices allow for better efficiency in power conversion due to reduced parasitic and optimized MOSFET packaging. Since the dead-time management is internal to the DrMOS, the dead-time management is more accurate than for traditional buck-boost converters leading to higher efficiency in conversion. Higher frequency of operation allows for smaller inductor size, which in turn reduces the z-height of the charger comprising the DrMOS based buck-boost converter. The buck-boost converter of various embodiments comprises dual-folded bootstrap for DrMOS devices. In some embodiments, in addition to the traditional bootstrap capacitors, folded bootstrap capacitors are added that cross-couple inductor nodes to the two sets of DrMOS switches.

In some embodiments, device 5500 comprises Power Control Unit (PCU) 5510 (also referred to as Power Management Unit (PMU), Power Management Controller (PMC), Power Unit (p-unit), etc.). In an example, some sections of PCU 5510 may be implemented by one or more processing cores 5508, and these sections of PCU 5510 are symbolically illustrated using a dotted box and labelled PCU 5510*a*. In an example, some other sections of PCU 5510 may be implemented outside the processing cores 5508, and these sections of PCU 5510 are symbolically illustrated using a dotted box and labelled as PCU 5510*b*. PCU 5510 may implement various power management operations for device 5500. PCU 5510 may include hardware interfaces, hardware circuitries, connectors, registers, etc., as well as software components (e.g., drivers, protocol stacks), to implement various power management operations for device 5500.

In various embodiments, PCU or PMU 5510 is organized in a hierarchical manner forming a hierarchical power management (HPM). HPM of various embodiments builds a capability and infrastructure that allows for package level management for the platform, while still catering to islands of autonomy that might exist across the constituent die in the package. HPM does not assume a pre-determined mapping of physical partitions to domains. An HPM domain can be aligned with a function integrated inside a dielet, to a dielet boundary, to one or more dielets, to a companion die, or even a discrete CXL device. HPM addresses integration of multiple instances of the same die, mixed with proprietary functions or 3rd party functions integrated on the same die or separate die, and even accelerators connected via CXL (e.g., Flexbus) that may be inside the package, or in a discrete form factor.

HPM enables designers to meet the goals of scalability, modularity, and late binding. HPM also allows PMU functions that may already exist on other dice to be leveraged, instead of being disabled in the flat scheme. HPM enables management of any arbitrary collection of functions independent of their level of integration. HPM of various embodiments is scalable, modular, works with symmetric multi-chip processors (MCPs), and works with asymmetric MCPs. For example, HPM does not need a signal PM controller and package infrastructure to grow beyond reasonable scaling limits. HPM enables late addition of a die in a package without the need for change in the base die infrastructure. HPM addresses the need of disaggregated solutions having dies of different process technology nodes coupled in a single package. HPM also addresses the needs of companion die integration solutions—on and off package.

In various embodiments, each die (or dielet) includes a power management unit (PMU) or p-unit. For example, processor dies can have a supervisor p-unit, supervisee p-unit, or a dual role supervisor/supervisee p-unit. In some embodiments, an I/O die has its own dual role p-unit such as supervisor and/or supervisee p-unit. The p-units in each die can be instances of a generic p-unit. In one such example, all p-units have the same capability and circuits, but are configured (dynamically or statically) to take a role of a supervisor, supervisee, and/or both. In some embodiments, the p-units for compute dies are instances of a compute p-unit while p-units for IO dies are instances of an IO p-unit different from the compute p-unit. Depending on the role, p-unit acquires specific responsibilities to manage power of the multichip module and/or computing platform. While various p-units are described for dies in a multichip module or system-on-chip, a p-unit can also be part of an external device such as I/O device.

Here, the various p-units do not have to be the same. The HPM architecture can operate very different types of p-units. One common feature for the p-units is that they are expected to receive HPM messages and are expected to be able to comprehend them. In some embodiments, the p-unit of IO dies may be different than the p-unit of the compute dies. For example, the number of register instances of each class of register in the IO p-unit is different than those in the p-units of the compute dies. An IO die has the capability of being an HPM supervisor for CXL connected devices, but compute die may not need to have that capability. The IO and computes dice also have different firmware flows and possibly different firmware images. These are choices that an implementation can make. An HPM architecture can choose to have one superset firmware image and selectively execute flows that are relevant to the die type the firmware is associated with. Alternatively, there can be a customer firmware for each p-unit type; it can allow for more streamlined sizing of the firmware storage requirements for each p-unit type.

The p-unit in each die can be configured as a supervisor p-unit, supervisee p-unit or with a dual role of supervisor/supervisee. As such, p-units can perform roles of supervisor or supervisee for various domains. In various embodiments, each instance of p-unit is capable of autonomously managing local dedicated resources and contains structures to aggregate data and communicate between instances to enable shared resource management by the instance configured as the shared resource supervisor. A message and wire-based infrastructure is provided that can be duplicated and configured to facilitate management and flows between multiple p-units.

In some embodiments, power and thermal thresholds are communicated by a supervisor p-unit to supervisee p-units. For example, a supervisor p-unit learns of the workload (present and future) of each die, power measurements of each die, and other parameters (e.g., platform level power boundaries) and determines new power limits for each die. These power limits are then communicated by supervisor p-units to the supervisee p-units via one or more interconnects and fabrics. In some embodiments, a fabric indicates a group of fabrics and interconnect including a first fabric, a second fabric, and a fast response interconnect. In some embodiments, the first fabric is used for common communication between a supervisor p-unit and a supervisee p-unit. These common communications include change in voltage, frequency, and/or power state of a die which is planned based on a number of factors (e.g., future workload, user behavior, etc.). In some embodiments, the second fabric is used for higher priority communication between supervisor p-unit and supervisee p-unit. Example of higher priority communication include a message to throttle because of a possible thermal runaway condition, reliability issue, etc. In some embodiments, a fast response interconnect is used for communicating fast or hard throttle of all dies. In this case, a supervisor p-unit may send a fast throttle message to all other p-units, for example. In some embodiments, a fast response interconnect is a legacy interconnect whose function can be performed by the second fabric.

The HPM architecture of various embodiments enables scalability, modularity, and late binding of symmetric and/or asymmetric dies. Here, symmetric dies are dies of same size, type, and/or function, while asymmetric dies are dies of different size, type, and/or function. Hierarchical approach also allows PMU functions that may already exist on other dice to be leveraged, instead of being disabled in the traditional flat power management scheme. HPM does not assume a pre-determined mapping of physical partitions to domains. An HPM domain can be aligned with a function integrated inside a dielet, to a dielet boundary, to one or more dielets, to a companion die, or even a discrete CXL device. HPM enables management of any arbitrary collection of functions independent of their level of integration. In some embodiments, a p-unit is declared a supervisor p-unit based on one or more factors. These factors include memory size, physical constraints (e.g., number of pin-outs), and locations of sensors (e.g., temperature, power consumption, etc.) to determine physical limits of the processor.

The HPM architecture of various embodiments, provides a means to scale power management so that a single p-unit instance does not need to be aware of the entire processor. This enables power management at a smaller granularity and improves response times and effectiveness. Hierarchical structure maintains a monolithic view to the user. For example, at an operating system (OS) level, HPM architecture gives the OS a single PMU view even though the PMU is physically distributed in one or more supervisor-supervisee configurations.

In some embodiments, the HPM architecture is centralized where one supervisor controls all supervisees. In some embodiments, the HPM architecture is decentralized, wherein various p-units in various dies control overall power management by peer-to-peer communication. In some embodiments, the HPM architecture is distributed where there are different supervisors for different domains. One example of a distributed architecture is a tree-like architecture.

In some embodiments, device 5500 comprises Power Management Integrated Circuit (PMIC) 5512, e.g., to implement various power management operations for device 5500. In some embodiments, PMIC 5512 is a Reconfigurable Power Management ICs (RPMICs) and/or an IMVP (Intel® Mobile Voltage Positioning). In an example, the PMIC is within an IC die separate from processor 5504. The may implement various power management operations for device 5500. PMIC 5512 may include hardware interfaces, hardware circuitries, connectors, registers, etc., as well as software components (e.g., drivers, protocol stacks), to implement various power management operations for device 5500.

In an example, device 5500 comprises one or both PCU 5510 or PMIC 5512. In an example, any one of PCU 5510 or PMIC 5512 may be absent in device 5500, and hence, these components are illustrated using dotted lines.

Various power management operations of device 5500 may be performed by PCU 5510, by PMIC 5512, or by a combination of PCU 5510 and PMIC 5512. For example, PCU 5510 and/or PMIC 5512 may select a power state (e.g., P-state) for various components of device 5500. For example, PCU 5510 and/or PMIC 5512 may select a power state (e.g., in accordance with the ACPI (Advanced Configuration and Power Interface) specification) for various components of device 5500. Merely as an example, PCU 5510 and/or PMIC 5512 may cause various components of the device 5500 to transition to a sleep state, to an active state, to an appropriate C state (e.g., C0 state, or another appropriate C state, in accordance with the ACPI specification), etc. In an example, PCU 5510 and/or PMIC 5512 may control a voltage output by VR 5514 and/or a frequency of a clock signal output by the clock generator, e.g., by outputting the VID signal and/or the FID signal, respectively. In an example, PCU 5510 and/or PMIC 5512 may control battery power usage, charging of battery 5518, and features related to power saving operation.

The clock generator 5516 can comprise a phase locked loop (PLL), frequency locked loop (FLL), or any suitable clock source. In some embodiments, each core of processor 5504 has its own clock source. As such, each core can operate at a frequency independent of the frequency of operation of the other core. In some embodiments, PCU 5510 and/or PMIC 5512 performs adaptive or dynamic frequency scaling or adjustment. For example, clock frequency of a processor core can be increased if the core is not operating at its maximum power consumption threshold or limit. In some embodiments, PCU 5510 and/or PMIC 5512 determines the operating condition of each core of a processor, and opportunistically adjusts frequency and/or power supply voltage of that core without the core clocking source (e.g., PLL of that core) losing lock when the PCU 5510 and/or PMIC 5512 determines that the core is operating below a target performance level. For example, if a core is drawing current from a power supply rail less than a total current allocated for that core or processor 5504, then PCU 5510 and/or PMIC 5512 can temporality increase the power draw for that core or processor 5504 (e.g., by increasing clock frequency and/or power supply voltage level) so that the core or processor 5504 can perform at higher performance level. As such, voltage and/or frequency can be increased temporality for processor 5504 without violating product reliability.

In an example, PCU 5510 and/or PMIC 5512 may perform power management operations, e.g., based at least in part on receiving measurements from power measurement circuitries 5542, temperature measurement circuitries 5540, charge level of battery 5518, and/or any other appropriate information that may be used for power management. To that end, PMIC 5512 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 5510 and/or PMIC 5512 in at least one embodiment to allow PCU 5510 and/or PMIC 5512 to manage processor core energy at least in part based on value(s) detected by one or more of the sensors.

Also illustrated is an example software stack of device 5500 (although not all elements of the software stack are illustrated). Merely as an example, processors 5504 may execute application programs 5550, Operating System 5552, one or more Power Management (PM) specific application programs (e.g., generically referred to as PM applications 5558), and/or the like. PM applications 5558 may also be executed by the PCU 5510 and/or PMIC 5512. OS 5552 may also include one or more PM applications 5556a, 5556b, 5556c. The OS 5552 may also include various drivers 5554a, 5554b, 5554c, etc., some of which may be specific for power management purposes. In some embodiments, device 5500 may further comprise a Basic Input/output System (BIOS) 5520. BIOS 5520 may communicate with OS 5552 (e.g., via one or more drivers 5554), communicate with processors 5504, etc.

For example, one or more of PM applications 5558, 5556, drivers 5554, BIOS 5520, etc. may be used to implement power management specific tasks, e.g., to control voltage and/or frequency of various components of device 5500, to control wake-up state, sleep state, and/or any other appropriate power state of various components of device 5500, control battery power usage, charging of the battery 5518, features related to power saving operation, etc.

In some embodiments, battery 5518 is a Li-metal battery with a pressure chamber to allow uniform pressure on a battery. The pressure chamber is supported by metal plates (such as pressure equalization plate) used to give uniform pressure to the battery. The pressure chamber may include pressured gas, elastic material, spring plate, etc. The outer skin of the pressure chamber is free to bow, restrained at its edges by (metal) skin, but still exerts a uniform pressure on the plate that is compressing the battery cell. The pressure chamber gives uniform pressure to battery, which is used to enable high-energy density battery with, for example, 20% more battery life.

In some embodiments, pCode executing on PCU 5510a/b has a capability to enable extra compute and telemetries resources for the runtime support of the pCode. Here pCode refers to a firmware executed by PCU 5510a/b to manage performance of the 5501. For example, pCode may set frequencies and appropriate voltages for the processor. Part of the pCode are accessible via OS 5552. In various embodiments, mechanisms and methods are provided that dynamically change an Energy Performance Preference (EPP) value based on workloads, user behavior, and/or system conditions. There may be a well-defined interface between OS 5552 and the pCode. The interface may allow or facilitate the software configuration of several parameters and/or may provide hints to the pCode. As an example, an EPP parameter may inform a pCode algorithm as to whether performance or battery life is more important.

This support may be done as well by the OS 5552 by including machine-learning support as part of OS 5552 and either tuning the EPP value that the OS hints to the hardware (e.g., various components of SoC 5501) by machine-learning prediction, or by delivering the machine-learning prediction to the pCode in a manner similar to that done by a Dynamic Tuning Technology (DTT) driver. In this model, OS 5552 may have visibility to the same set of telemetries as are available to a DTT. As a result of a DTT machine-learning hint setting, pCode may tune its internal algorithms to achieve optimal power and performance results following the machine-learning prediction of activation type. The pCode as example may increase the responsibility for the processor utilization change to enable fast response for user activity, or may increase the bias for energy saving either by reducing the responsibility for the processor utilization or by saving more power and increasing the performance lost by tuning the energy saving optimization. This approach may facilitate saving more battery life in case the types of activities enabled lose some performance level over what the system can enable. The pCode may include an algorithm for dynamic EPP that may take the two inputs, one from OS 5552 and the other from software such as DTT, and may selectively choose to provide higher performance and/or responsiveness. As part of this method, the pCode may enable in the DTT an option to tune its reaction for the DTT for different types of activity.

In some embodiments, pCode improves the performance of the SoC in battery mode. In some embodiments, pCode allows drastically higher SoC peak power limit levels (and thus higher Turbo performance) in battery mode. In some embodiments, pCode implements power throttling and is part of Intel's Dynamic Tuning Technology (DTT). In various embodiments, the peak power limit is referred to PL4. However, the embodiments are applicable to other peak power limits. In some embodiments, pCode sets the Vth threshold voltage (the voltage level at which the platform will throttle the SoC) in such a way as to prevent the system from unexpected shutdown (or black screening). In some embodiments, pCode calculates the Psoc,pk SoC Peak Power Limit (e.g., PL4), according to the threshold voltage (Vth). These are two dependent parameters, if one is set, the other can be calculated. pCode is used to optimally set one parameter (Vth) based on the system parameters, and the history of the operation. In some embodiments, pCode provides a scheme to dynamically calculate the throttling level (Psoc,th) based on the available battery power (which changes slowly) and set the SoC throttling peak power (Psoc,th). In some embodiments, pCode decides the frequencies and voltages based on Psoc,th. In this case, throttling events have less negative effect on the SoC performance Various embodiments provide a scheme which allows maximum performance (Pmax) framework to operate.

In some embodiments, VR 5514 includes a current sensor to sense and/or measure current through a high-side switch of VR 5514. In some embodiments the current sensor uses an amplifier with capacitively coupled inputs in feedback to sense the input offset of the amplifier, which can be compensated for during measurement. In some embodiments, the amplifier with capacitively coupled inputs in feedback is used to operate the amplifier in a region where the input common-mode specifications are relaxed, so that the feedback loop gain and/or bandwidth is higher. In some embodiments, the amplifier with capacitively coupled inputs in feedback is used to operate the sensor from the converter input voltage by employing high-PSRR (power supply rejection ratio) regulators to create a local, clean supply voltage, causing less disruption to the power grid in the switch area. In some embodiments, a variant of the design can be used to sample the difference between the input voltage and the controller supply, and recreate that between the drain voltages of the power and replica switches. This allows the sensor to not be exposed to the power supply voltage. In some embodiments, the amplifier with capacitively coupled inputs in feedback is used to compensate for power delivery network related (PDN-related) changes in the input voltage during current sensing.

In some embodiments, VR 5514 includes LDO regulator that comprises a dual loop regulation mechanism. A first loop of the dual loop is an analog loop that compares the voltage on the output supply node with a reference, and generates a bias or voltage control to control a strength of the final power switch. The first loop regulates the output voltage relative to a reference voltage by minimizing the error between the two voltages. A second loop of the dual loop is a digital loop that controls a current source which injects current on the gate of the final power switch to boost current for a load. The second loop is an auxiliary loop. In some embodiments, the auxiliary loop boost the current load for a set interval till the tracking BW of the LDO resolves the error in the output, thereby reducing the peak-to-peak noise. In some embodiments, the quiescent current is not increased a lot by the second loop since the second loop circuit is on for a fraction of the entire LDO operation. In some embodiments, to combat data pattern dependency, a voltage comparator is used to control the current injector to prevent the output voltage going in the opposite direction.

Some embodiments use three components to adjust the peak power of SoC 5501 based on the states of a USB TYPE-C device 5529. These components include OS Peak Power Manager (part of OS 5552), USB TYPE-C Connector Manager (part of OS 5552), and USB TYPE-C Protocol Device Driver (e.g., one of drivers 5554*a*, 5554*b*, 5554*c*). In some embodiments, the USB TYPE-C Connector Manager sends a synchronous request to the OS Peak Power Manager when a USB TYPE-C power sink device is attached or detached from SoC 5501, and the USB TYPE-C Protocol Device Driver sends a synchronous request to the Peak Power Manager when the power sink transitions device state. In some embodiments, the Peak Power Manager takes power budget from the CPU when the USB TYPE-C connector is attached to a power sink and is active (e.g., high power device state). In some embodiments, the Peak Power Manager gives back the power budget to the CPU for performance when the USB TYPE-C connector is either detached or the attached and power sink device is idle (lowest device state).

In some embodiments, logic is provided to dynamically pick the best operating processing core for BIOS power-up flows and sleep exit flows (e.g., S3, S4, and/or S5). The selection of the bootstrap processor (BSP) is moved to an early power-up time instead of a fixed hardware selection at any time. For maximum boot performance, the logic selects the fastest capable core as the BSP at an early power-up time. In addition, for maximum power saving, the logic selects the most power efficient core as the BSP. Processor or switching for selecting the BSP happens during the boot-up as well as power-up flows (e.g., S3, S4, and/or S5 flows).

In some embodiments, the memories herein are organized in multi-level memory architecture and their performance is governed by a decentralized scheme. The decentralized scheme includes p-unit 5510 and memory controllers. In some embodiments, the scheme dynamically balances a number of parameters such as power, thermals, cost, latency and performance for memory levels that are progressively further away from the processor in the platform 5500 based on how applications are using memory levels that are further away from processor cores. In some examples, the decision making for the state of the far memory (FM) is decentralized. For example, a processor power management unit (p-unit), near memory controller (NMC), and/or far memory host controller (FMHC) makes decisions about the power and/or performance state of the FM at their respective levels. These decisions are coordinated to provide the most optimum power and/or performance state of the FM for a given time. The power and/or performance state of the memories adaptively change to changing workloads and other parameters even when the processor(s) is in a particular power state.

In some embodiments, an apparatus is provided that executes a power-up scheme for system 5500. In some embodiment, the apparatus applies a biometric sensor (e.g., a fingerprint sensor, eye sensor, etc.) to authenticate a user before enabling power-up of computing system 5500 or to resume transition to a power state (e.g., one of the power states defined by the Advance Configuration and Power Interface (ACPI)). Output of the biometric sensor is compared against data of a registered user for a match. The data may include an original copy of an output of the biometric sensor saved in a non-volatile memory (e.g., serial peripheral interface (SPI) flash device). If a match exists, a logic in the computing system will allow the computing system to power-up. In the absence of a match, the computing system will not be powered up. In some examples, battery charging of battery 5518 is also disabled if the match is not found.

In some embodiments, a supervisor p-unit (or PCU) 5510 is used to executed a scheme for measuring AC and DC load-line (LL) using voltage and current monitoring apparatus. During calibration for LL measurement, a tested or known workload is executed on SoC 5501. The calibration can be done when the processor is first used in a real-time system (customer) scenario, or repeated whenever necessary to compensate silicon aging or other effects that affect the LL values. LL is estimated, determined, and/or calculated for each power supply rail in the processor or SoC 5501. The measured LL is used in calculations that determine the operating voltage of an input voltage regulator (VR) 5514 at run time, thereby optimizing the power/performance characteristics of that specific system 5500.*d*

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" is any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. The examples can be combined in any combinations. For example, example 4 can be combined with example 2.

Example 1

An apparatus comprising: a voltage regulator having an input supply rail to provide an input power, and an output supply rail to provide an output power; a processor coupled to the output supply rail; a voltage and/or current measurement apparatus coupled to the processor, wherein the voltage and/or current measurement apparatus is to measure voltage and/or current on the output supply rail; and logic to determine an AC loadline and a DC loadline from the voltage and/or current in response to execution of one or more workloads on the processor.

Example 2

The apparatus of example 1, wherein the logic is to introduce a current step via the one or more workloads to cause an output voltage on the output supply rail to droop.

Example 3

The apparatus of example 2, wherein the logic is to measure a first voltage and/or current during a steady-state condition of the output voltage on the output supply rail, wherein the steady-state condition occurs when the current step has constant current which is substantially zero.

Example 4

The apparatus of example 3, wherein the logic is to measure a second voltage and/or current during an active steady-state condition of the output voltage on the output supply rail, wherein the active steady-state condition occurs when the current step completes its ramp and the output voltage exhibits a third voltage droop.

Example 5

The apparatus of example 4, wherein the logic is to store the first voltage and/or current and a second voltage and/or current in memory.

Example 6

The apparatus of example 5, wherein the logic is to determine the AC loadline by dividing the second voltage by the second current.

Example 7

The apparatus of example 5, wherein the logic is to determine the DC loadline by dividing the first voltage by the first current.

Example 8

The apparatus of example 1, wherein the processor has multiple power supply rails for multiple power supply domains, wherein the logic is to determine an AC loadline and a DC loadline for each of the multiple power supply rails.

Example 9

The apparatus of example 1, wherein the processor has multiple cores.

Example 10

A machine-readable storage media having machine-readable instructions stored thereon, that when executed cause one or more processors to perform a method comprising: executing one or more workloads, wherein the one or more processors are coupled to an output supply rail, wherein a voltage regulator is to generate an output power on the output supply rail using an input power from an input supply rail; measuring voltage and/or current on the output supply rail; and determining an AC loadline and a DC loadline from the voltage and/or current on the output supply rail in response to the execution of the one or more workloads.

Example 11

The machine-readable storage media of example 10, having machine-readable instructions stored thereon, that when executed cause the one or more processors to perform the method comprising: introducing a current step via the one or more workloads to cause an output voltage on the output supply rail to droop.

Example 12

The machine-readable storage media of example 11, wherein measuring the voltage and/or current on the output supply rail comprises measuring a first voltage and/or current during a steady-state condition of the output voltage on the output supply rail, wherein the steady-state condition occurs when the current step has constant current which is substantially zero.

Example 13

The machine-readable storage media of example 12, wherein measuring the voltage and/or current on the output supply rail comprises: measuring a second voltage and/or current during an active steady-state condition of the output voltage on the output supply rail, wherein the active steady-state condition occurs when the current step completes its ramp and the output voltage exhibits a third voltage droop.

Example 14

The machine-readable storage media of example 13, having further machine-readable instructions stored thereon, that when executed cause the one or more processors to perform the method comprising: storing the first voltage and/or current and a second voltage and/or current in memory.

Example 15

The machine-readable storage media of example 13, having further machine-readable instructions stored thereon, that when executed cause the one or more processors to perform the method comprising: determining the AC loadline by dividing the second voltage by the second current; and determining the DC loadline by dividing the first voltage by the first current.

Example 16

A system comprising: a platform comprising a voltage regulator having an input supply rail to provide an input power, and an output supply rail to provide an output power; and a package on the platform, the package including a processor having or more processor cores, wherein the processor is coupled to the output supply rail, wherein the processor includes: a voltage and/or current measurement apparatus, wherein the voltage measurement apparatus is to measure voltage and/or current on the output supply rail; and logic to determine an AC loadline and a DC loadline from the voltage and/or current in response to execution of one or more workloads on the processor.

Example 17

The system of example 16, wherein the logic is to: introduce a current step via the one or more workloads to cause an output voltage on the output supply rail to droop; measure a first voltage and/or current during a steady-state condition of the output voltage on the output supply rail, wherein the steady-state condition occurs when the current step has constant current which is substantially zero; and measure a second voltage and/or current during an active steady-state condition of the output voltage on the output supply rail, wherein the active steady-state condition occurs when the current step completes its ramp and the output voltage exhibits a third voltage droop.

Example 18

The system of example 17, wherein the logic is to store the first voltage and/or current and a second voltage and/or current in memory.

Example 19

The system of example 17, wherein the logic is to: determine the AC loadline by dividing the second voltage by the second current; and determine the DC loadline by dividing the first voltage by the first current.

Example 20

The system of example 17, wherein the processor has multiple power supply rails for multiple power supply domains, wherein the logic is to determine an AC loadline and a DC loadline for each of the multiple power supply rails.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus, comprising:
a voltage regulator having an input supply rail to provide an input power, and an output supply rail to provide an output power;
a processor coupled to the output supply rail;
a voltage and/or current measurement apparatus coupled to the processor, wherein the voltage and/or current measurement apparatus is to measure voltage and/or current on the output supply rail; and
logic to determine an alternating current (AC) load line and a direct current (DC) load line from the voltage and/or current in response to execution of one or more workloads on the processor.

2. The apparatus of claim 1, wherein the logic is to introduce a current step via the one or more workloads to cause an output voltage on the output supply rail to droop.

3. The apparatus of claim 2, wherein the logic is to measure a first voltage and/or current during a steady-state condition of the output voltage on the output supply rail, wherein the steady-state condition occurs when the current step has constant current which is substantially zero.

4. The apparatus of claim 3, wherein the logic is to measure a second voltage and/or current during an active steady-state condition of the output voltage on the output supply rail, wherein the active steady-state condition occurs when the current step completes its ramp and the output voltage exhibits a third voltage droop.

5. The apparatus of claim 4, wherein the logic is to store the first voltage and/or current and a second voltage and/or current in memory.

6. The apparatus of claim 5, wherein the logic is to determine the AC load line by dividing the second voltage by the second current.

7. The apparatus of claim 5, wherein the logic is to determine the DC load line by dividing the first voltage by the first current.

8. The apparatus of claim 1, wherein the processor has multiple power supply rails for multiple power supply domains, wherein the logic is to determine an AC load line and a DC load line for each of the multiple power supply rails.

9. The apparatus of claim 1, wherein the processor has multiple cores.

10. A non-transitory machine-readable storage media having machine-readable instructions stored thereon, that when executed cause one or more processors to:
- execute one or more workloads, wherein the one or more processors are coupled to an output supply rail, wherein a voltage regulator is to generate an output power on the output supply rail using an input power from an input supply rail;
- measure voltage and/or current on the output supply rail; and
- determine an alternating current (AC) load line and a direct current (DC) load line from the voltage and/or current on the output supply rail in response to the execution of the one or more workloads.

11. The non-transitory machine-readable storage media of claim 10, having machine-readable instructions stored thereon, that when executed cause the one or more processors to:
- introduce a current step via the one or more workloads to cause an output voltage on the output supply rail to droop.

12. The non-transitory machine-readable storage media of claim 11, wherein measuring the voltage and/or current on the output supply rail comprises:
- measuring a first voltage and/or current during a steady-state condition of the output voltage on the output supply rail, wherein the steady-state condition occurs when the current step has constant current which is substantially zero.

13. The non-transitory machine-readable storage media of claim 12, wherein measuring the voltage and/or current on the output supply rail comprises:
- measuring a second voltage and/or current during an active steady-state condition of the output voltage on the output supply rail, wherein the active steady-state condition occurs when the current step completes its ramp and the output voltage exhibits a third voltage droop.

14. The non-transitory machine-readable storage media of claim 13, having further machine-readable instructions stored thereon, that when executed cause the one or more processors to:
- store the first voltage and/or current and a second voltage and/or current in memory.

15. The non-transitory machine-readable storage media of claim 13, having further machine-readable instructions stored thereon, that when executed cause the one or more processors to:
- determine the AC load line by dividing the second voltage by the second current; and
- determine the DC load line by dividing the first voltage by the first current.

16. A system, comprising:
- a platform comprising a voltage regulator having an input supply rail to provide an input power, and an output supply rail to provide an output power; and
- a package on the platform, the package including a processor having one or more processor cores, wherein the processor is coupled to the output supply rail, wherein the processor includes:
- a voltage and/or current measurement apparatus, wherein the voltage measurement apparatus is to measure voltage and/or current on the output supply rail; and
- logic to determine an alternating current (AC) load line and a direct current (DC) load line from the voltage and/or current in response to execution of one or more workloads on the processor.

17. The system of claim 16, wherein the logic is to:
- introduce a current step via the one or more workloads to cause an output voltage on the output supply rail to droop;
- measure a first voltage and/or current during a steady-state condition of the output voltage on the output supply rail, wherein the steady-state condition occurs when the current step has constant current which is substantially zero; and
- measure a second voltage and/or current during an active steady-state condition of the output voltage on the output supply rail, wherein the active steady-state condition occurs when the current step completes its ramp and the output voltage exhibits a third voltage droop.

18. The system of claim 17, wherein the logic is to store the first voltage and/or current and a second voltage and/or current in memory.

19. The system of claim 17, wherein the logic is to:
- determine the AC load line by dividing the second voltage by the second current; and
- determine the DC load line by dividing the first voltage by the first current.

20. The system of claim 17, wherein the processor has multiple power supply rails for multiple power supply domains, wherein the logic is to determine an AC load line and a DC load line for each of the multiple power supply rails.

\* \* \* \* \*